United States Patent [19]

Shurboff

[11] Patent Number: 6,049,233

[45] Date of Patent: Apr. 11, 2000

[54] PHASE DETECTION APPARATUS

[75] Inventor: Carl L. Shurboff, Grayslake, Ill.

[73] Assignee: Motorola, Inc., Schaumburg, Ill.

[21] Appl. No.: 09/042,753

[22] Filed: Mar. 17, 1998

[51] Int. Cl.[7] .................................................. G01R 29/00
[52] U.S. Cl. ........................ 327/2; 327/3; 327/7; 327/149
[58] Field of Search .................................... 327/2, 3, 7, 8,
327/148, 149, 156, 157, 158, 12

[56] References Cited

U.S. PATENT DOCUMENTS

| | | | |
|---|---|---|---|
| 4,378,509 | 3/1983 | Hatchett et al. | 327/5 |
| 4,970,475 | 11/1990 | Gillig | 331/25 |
| 5,432,826 | 7/1995 | Rieder | 375/371 |
| 5,722,052 | 2/1998 | Abdi et al. | 455/75 |
| 5,736,872 | 4/1998 | Sharma et al. | 327/3 |
| 5,889,437 | 3/1999 | Lee | 331/16 |
| 5,892,380 | 4/1999 | Quist | 327/172 |

Primary Examiner—Kenneth B. Wells
Assistant Examiner—Hai L. Nguyen
Attorney, Agent, or Firm—John G. Rauch; Paul J. Bartusiak

[57] ABSTRACT

A phase detector circuit includes a first flip flop, a second flip flop, a first charge pump and a second charge pump. Outputs of the flip flops directly enable the charge pumps in response to received clocking signals. A first delay circuit delays the output signal from the first flip flop to an AND gate which combines the delayed output signal and the output signal from the second flip flop. The AND gate output is delayed in a second delay circuit to produce a delayed reset signal which resets both flip flops simultaneously and disables the charge pumps. The phase detector circuit balances the amount of charge provided to a phase locked loop near the in-phase condition to improve linearization of the phase detector.

12 Claims, 3 Drawing Sheets

PHASE DETECTION APPARATUS

FIELD OF THE INVENTION

The present invention generally relates to phase detection apparatus. More particularly, the present invention relates to an improved phase detection apparatus for generating a phase difference signal in a chase locked loop.

BACKGROUND OF THE INVENTION

Phase detector circuits are commonly used to detect a phase difference between two input signals. One typical application is in a phase locked loop (PLL) to detect a phase difference between a reference signal from a reference oscillator and a loop feedback signal. The output of the phase detector circuit is used to adjust the phase relationship between the reference signal and output signal of the PLL.

One phase detector circuit includes two D-type flip flops, a delay element and an AND gate. The D inputs of the flip flops are tied to a high logic level. One flip flop is clocked by a reference signal, the other flip flop is clocked by a feedback signal from a voltage controlled oscillator (VCO) of a PLL. The outputs of the flip flops are ANDed together and the result delayed in the delay element, then used to reset one of the flip flops. The other flip flop is reset with the result from the AND gate without being delayed. Each flip flop enables a charge pump. One charge pump provides a positive current to the VCO, the other charge pump provides negative current to the VCO. Charge is added to correct phase mismatch between the reference signal and the feedback signal.

This phase detector circuit is generally adequate for most applications. However, there is still an imbalance of charge added to or subtracted from the VCO by the charge pumps, particularly near in-phase condition. The result is phase noise. The amount of phase noise can be unacceptable in certain applications, such as in a fractional-n synthesizer. To optimize the phase noise of the fractional-n synthesizer, equal amounts of charge must be added and subtracted from the loop for a given phase offset. The prior art phase detector circuit has been inadequate for this purpose.

Accordingly, there is a need in the art for a phase detector which provides equal amounts of charge to the loop near the in-phase condition.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
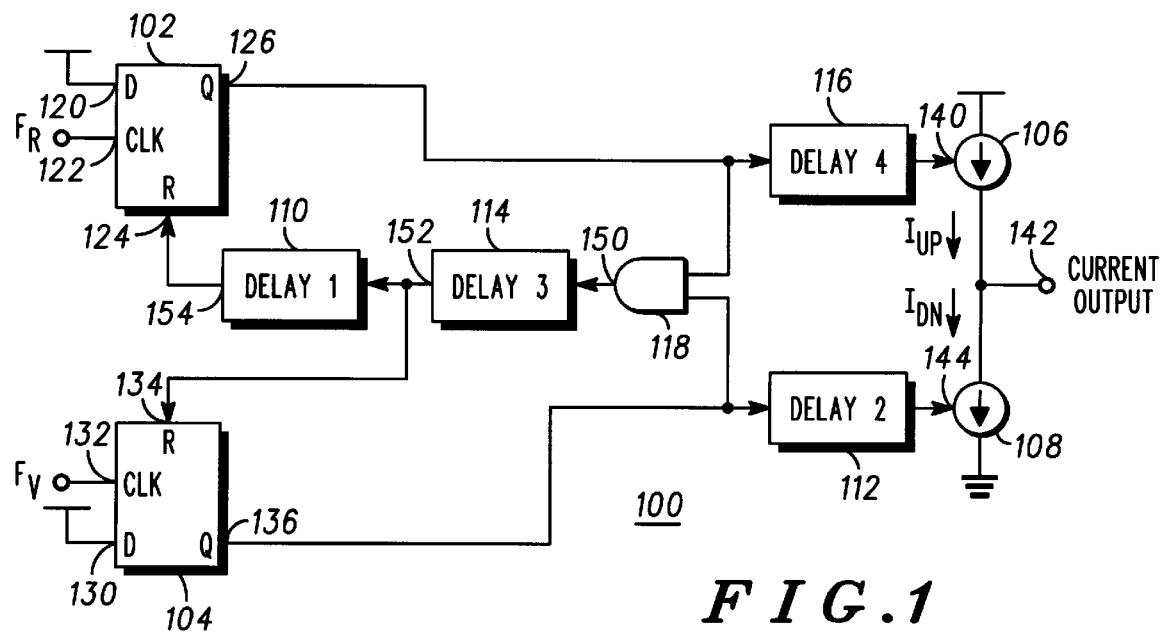
FIG. 1 is a block diagram of a phase detector circuit.

Referring now to FIG. 1, it shows a block diagram of a phase detector circuit 100. The phase detector circuit 100 includes a first storage circuit, D-type flip flop 102, a second storage circuit, D-type flip flop 104, a first charge pump 106 and a second charge pump 108. The phase detector circuit 100 further includes a first delay circuit 110, a second delay circuit 112, a third delay circuit 114, a fourth delay circuit 116, and a AND gate 118.

The first flip flop 102 has a data input 120 tied to a high logic level, such as the positive power supply, and a clock input 122 configured to receive a reference clock signal $F_r$. The first flip flop 102 further has a reset input 124 and an output 126. The second flip flop 104 is similarly configured and has a data input 130 tied to a high logic level and a clock input 132 configured to receive a variable clock signal $F_v$. The second flip flop 104 further has a reset input 134 and an output 136.

The first charge pump 106 has an enable input 140 coupled to the output 126 of the first flip flop 102 through fourth delay circuit 116. The first charge pump 106 has an output coupled to the output 142 of the phase detector circuit 100. The second charge pump 108 has an enable input 144 coupled to the output 136 of the second flip flop 104 through the second delay circuit 112. The second charge pump 108 is also coupled to the output 142. The first charge pump 106 provides an up current having a positive polarity to the output 142 when an enable signal is applied to the enable input 140. Similarly, the second charge pump provides a down current having a negative polarity to the output 142 in response to an enable signal applied to the enable input 144. The charge pumps are conventional in their design.

The delay circuits and the AND gate are configured to linearize the phase detector circuit 100 by equalizing the amount of charge supplied to the output 142. To optimize the phase noise of the phase detector circuit 100 and any circuits in which it is employed, equal amounts of charge must be added to and subtracted from the phase locked loop (PLL) for a given phase offset. Equalizing the charges is accomplished by adding in unequal delay circuits in the reset path of the phase detector.

The AND gate 118 has a first input coupled to the output 126 of the first flip flop 102 and a second input coupled to the output 136 of the second flip flop 104. The AND gate 118 further has an output 150. The third delay circuit 114 is coupled to the output 150 of the AND gate 118. The third delay circuit 114 has an output 152 coupled to the first delay circuit 110 and to the reset input 134 of the second flip flop 104. The first delay circuit 110 has an output 154 coupled to the reset input 124 of the first flip flop 102.

The third delay circuit 114 is used to set the minimum pulse width of the down current provided by the second charge pump 108. The sum of the delays provided by the first delay circuit 110 and the third delay circuit 114 is used to set the minimum pulse width of the up current.

Figure 2:
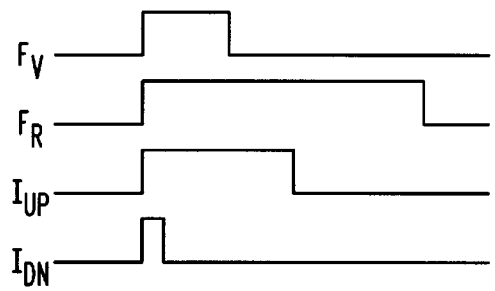
FIG. 2 is a timing diagram illustrating operation of the phase detector circuit of FIG. 1.
Figure 3:
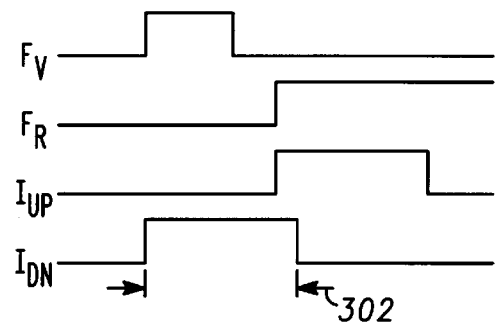
FIG. 3 is a timing diagram illustrating operation of the phase detector circuit of FIG. 1.
Figure 4:
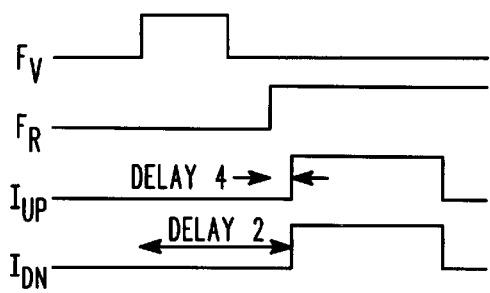
FIG. 4 is a timing diagram illustrating operation of the phase detector circuit of FIG. 1.

FIG. 2 is a timing diagram illustrating operation of the phase detector circuit of FIG. 1 used in conjunction with a phase locked loop (PLL). In FIG. 2, the second delay circuit 112 and the fourth delay circuit 116 are set to delays of 0 seconds and the PLL is not in lock. FIG. 2, FIG. 3 and FIG. 4 show the reference clock, designated $F_R$, the variable clock from the output of the PLL, designated $F_V$, the up current, designated $I_{UP}$, and the down current, designated $I_{DN}$. The horizontal axis shows time. In FIG. 2, with the loop out of lock, the up current is longer in duration than the down current.

In FIG. 3, the loop locks and the phase of the output signal is adjusted to obtain a zero net charge added to the loop. To accomplish this, with the second delay circuit 112 and the fourth delay circuit 116 set to 0 seconds duration, the down current pulse duration 302 is lengthened. Since the up current pulse and the down current pulse are not coincident in time, the noise floor of the loop will degrade. Accordingly, the second delay circuit 112 must be added to realign the up current and the down current. The effect of this is shown is FIG. 4.

In one application, the second delay circuit 112 must be designed to handle a minimum down current pulse width of 1 ns while delaying the pulse as much as 20 ns. To do this, each edge of the pulse is delayed by the same amount by using a reset flip flop through a current-capacitor or and resistor-capacitor delay. The edges of the pulse are recombined to form the total pulse. A circuit suitable for this purpose will be described below in conjunction with FIG. 10.

Referring again to FIG. 1, the fourth delay circuit 116 is added to balance the additional logic of the second delay circuit 112 which has been placed in the path of the down current. Other elements of the respective delays must be matched, as well.

The phase detector circuit 100 of FIG. 1 provides improved linearization and therefore improved performance over previous phase detectors. However, it is desirable to integrate such a circuit with other circuits in the form of a monolithic integrated circuit. In such an application, it is desirable to minimize the amount of circuitry used and thereby the required area on the surface of the integrated circuit. It is further desirable to minimize the total power consumption of the circuit. Accordingly, another design is preferable for such applications.

Figure 5:
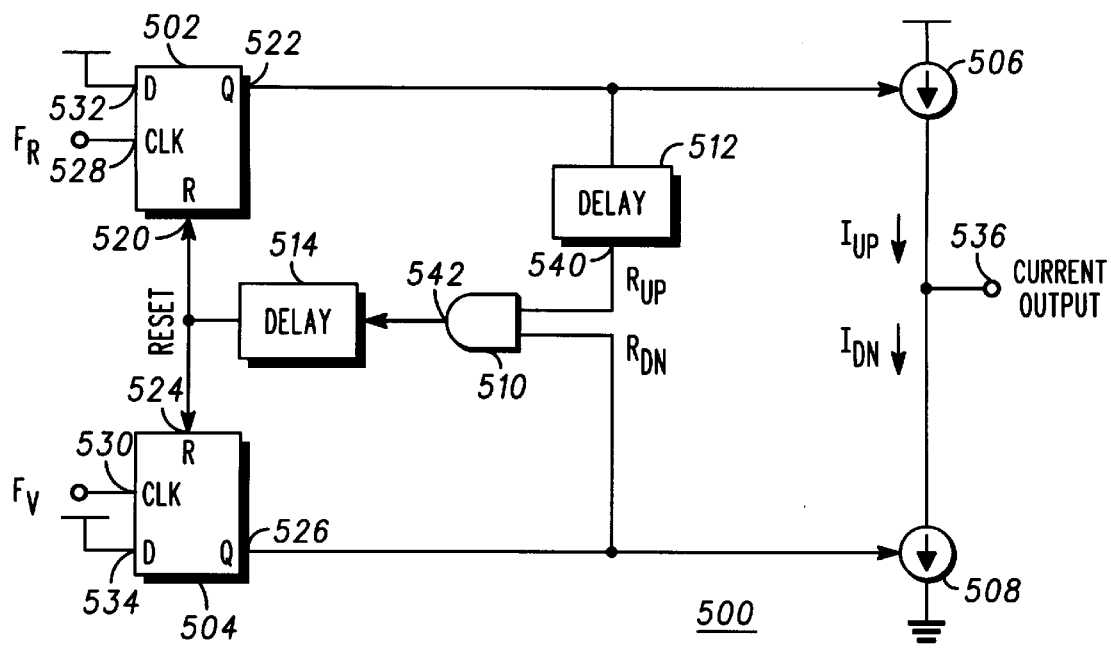
FIG. 5 is a block diagram of a phase detector circuit.

FIG. 5 is a block diagram of a phase detector circuit 500 in accordance with the present invention. The phase detector circuit 500 includes a first storage circuit, first flip flop 502, and a second storage circuit, second flip flop 504. The storage circuits are illustrated as D-type flip flops, but any suitable circuit configuration could be used, including other types of flip flops. The D-type flip flops illustrated provide the proper operation while reducing circuit area and power dissipation. Each storage circuit has a reset input and an output, labelled R and Q respectively in FIG. 5. The first flip flop 502 has a reset input 520 and an output 522. The second flip flop 504 has a reset input 524 an output 526. The storage circuits both also have clock inputs, labelled Clk in FIG. 5. The first flip flop 502 has a clock input 528 configured to receive a reference clock signal. The second flip flop 504 has a clock input 530 configured to receive a variable rate clock signal. The first flip flop 502 has a data input 532, labelled D in FIG. 5, tied to the positive power supply potential. Similarly, the second flip flop 504 has a data input 534 labelled D which is tied to the positive power supply potential. The D inputs of the flip flops could be tied to other suitable potentials or even time varying signals. The goal, however, is that a high logic level is presented to the Q outputs of the flip flops in response to a received clock signal. The Q outputs are subsequently reset to a low logic level by a RESET signal applied to the R reset inputs.

The phase detector circuit 500 further includes a first charge pump 506 coupled to the output 522 of the first storage circuit, first flip flop 502, to provide an up current in response to a first output signal from the first storage circuit. The up current is labelled $I_{UP}$, in FIG. 5. The first charge pump 506 provides the up current when the first output signal has a first value and does not provide the up current when the first output signal has a second value, so that the first output signal serves as an enable signal for the first charge pump 506. The phase detector circuit 500 further includes a first delay circuit 512 coupled to the output 522 of the first storage circuit, first flip flop 502, for producing a delayed output signal in response to the output signal from the first storage circuit. The phase detector circuit 500 still further includes a second charge pump 508 coupled to the output 526 of the second storage circuit, second flip flop 504, to provide a down current in response to a second output signal from the second storage circuit. The down current is labelled $I_{DN}$ in FIG. 5. The second charge pump 508 provides the down current when the second output signal has a first value and does not provide the down current when the second output signal has a second value, so that the second output signal serves as an enable signal for the second charge pump 508. Both the first charge pump 506 and the second charge pump 508 are conventional.

The phase detector circuit 500 still further includes an AND gate 510 having a first input coupled to an output 540 of the first delay circuit 512 and a second input coupled to the output 526 of the second storage circuit, second flip flop 504, and an output 542. The AND gate 510 forms a circuit which combines the delayed output signal and the second output signal to produce a reset signal. Lastly, the phase detector circuit 500 includes a second delay circuit 514 having an input coupled to the output 542 of the AND gate and an output coupled to the reset inputs of the storage circuits, reset input 520 of the first flip flop 502 and reset input 524 of the second flip flop 504. The second delay circuit 514 delays the reset signal to produce a delayed reset signal which is applied to the R reset inputs of the flip flops at substantially the same time.

The phase detector circuit 500 provides an output signal at an output 536 related to the phase difference between the reference clock signal and the variable clock signal. In the illustrated embodiment, the output signal is a current having a predetermined magnitude and variable duration. If the phase of the variable clock signal at clock input 530 leads the phase of the reference clock signal at clock input 528, net charge is subtracted to the output 536. If the phase of the variable clock signal lags the phase of the reference clock signal, net charge is added from the output 536. The phase detector circuit 500 is thus well-suited to use in a circuit such as a phase locked loop (PLL), but will have other applications as well.

In operation, the flip flops are in the reset condition. The high logic level at the D data inputs of the flip flops is clocked to the Q outputs by a respective received clock pulse, the reference clock signal at the clock input 528 of the first flip flop 502 and the variable clock signal at the clock input 530 of the second flip flop 504. When the Q output goes to a high logic level, the high level serves as an enable signal to the respective charge pump. In response to a high level at output 522, first charge pump 506 begins adding charge to the loop. In response to a high level at output 526, second charge pump begins subtracting charge from the loop.

The reset circuit, including first delay circuit 512, second delay circuit 514 and AND gate 510, operates as follows. The second input to the AND gate 510 goes to a high logic level as soon as the signal at the output 526 of the second flip flop goes high. This signal is labelled $R_{DN}$ in FIG. 5. The signal from the output 522 of the first flip flop 502 is delayed in the first delay circuit 512 by a predetermined time duration, such as 20 ns. After this duration, the delayed output signal, labelled $R_{UP}$ in FIG. 5, is applied to the first input of the AND gate 510. When both inputs to the AND gate 510 go high, the output 542 goes high, providing the reset signal. However, the reset signal is delayed by the second delay circuit by a second predetermined time duration. After this duration, the delayed reset signal is substantially simultaneously applied to the reset input 520 of the first flip flop 502 and the reset input 524 of the second flip flop 504. Application of the delayed reset signal resets both flip flops to the reset condition in which the output 522 and the output 526 are at a logic low level. This disables the first charge pump 506 and the second charge pump 508.

Figure 6:
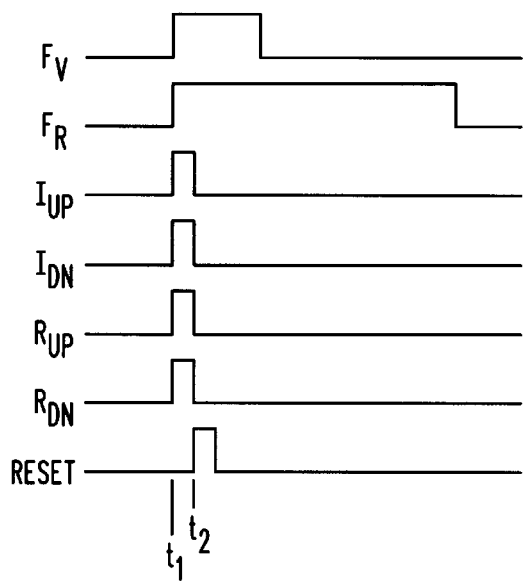
FIG. 6 is a timing diagram illustrating operation of the phase detector circuit of FIG. 5.

FIG. 6 is a timing diagram illustrating operation of the phase detector circuit 500 of FIG. 5 operated in conjunction with a phase locked loop. As operated in FIG. 6, the predetermined delay of the first delay circuit 512 is set to 0 seconds, equivalent to bypassing the first delay circuit 512. In FIG. 6, the rising edges of the variable clock $F_V$ and the reference clock $F_R$ are coincident and output currents $I_{DN}$ and $I_{UP}$ turn on at the same time, $t_1$. With zero delay, the two flip flops (FIG. 5) are reset simultaneously and the two output currents turn off at the same time, $t_2$. The pulse width, $t_2-t_1$, matches the duration of the second delay circuit 514 and is 1 ns in duration in the illustrated embodiment.

Figure 7:
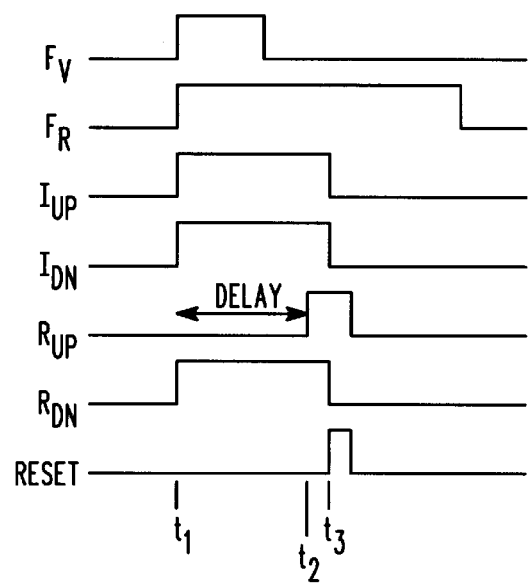
FIG. 7 is a timing diagram illustrating operation of the phase detector circuit of FIG. 5.

FIG. 7 is a timing diagram illustrating operation of the phase detector circuit 500 of FIG. 5 operated in conjunction with a phase locked loop. In FIG. 7, the duration of the first delay circuit 512 is set to a time duration greater than 0 seconds. Also, the rising edges of the variable clock $F_V$ and the reference clock $F_R$ are generally coincident at time $t_1$, indicating signals are in phase and the PLL is locked. Also at time $t_1$, the first charge pump 506 and the second charge pump 508 (FIG. 5) are enabled and begin supplying current to the loop and signal RDN goes high at the second input to the AND gate 510. After the duration of the first delay circuit 512, at time $t_2$, the signal RDN at the first input to the AND gate 510 goes high initiating the reset signal at the output 542 of the AND gate 510. After the duration of the second delay circuit 514, at time $t_3$, the delayed reset signal, labelled RESET in FIGS. 5 and 7, goes high, resetting the two flip flops. Upon reset, the signal at the output 522 of the first flip flop 502 goes low, turning off the first charge pump 506, and the signal $R_{DN}$ at the output 526 of the second flip flop 504 goes low, turning off the second charge pump 508. Thus, with the loop in lock and the first delay circuit 512 not bypassed, the phase detector circuit 500 generates substantially equal up current and down current pulses.

Figure 8:
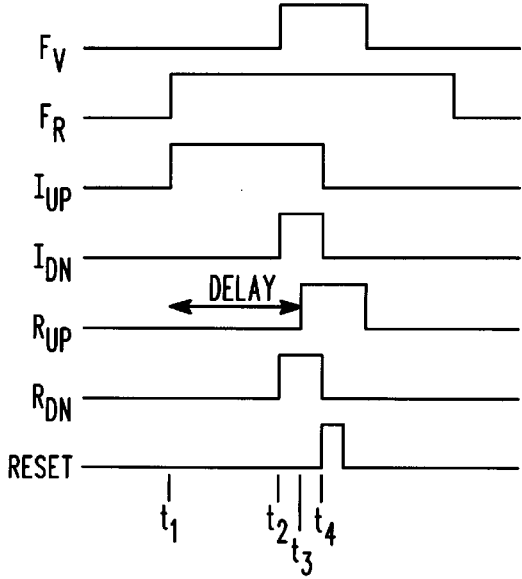
FIG. 8 is a timing diagram illustrating operation of the phase detector circuit of FIG. 5.

FIG. 8 is a timing diagram illustrating operation of the phase detector circuit 500 of FIG. 5 operated in conjunction with a phase locked loop. In FIG. 8, the variable clock signal $F_V$ lags the reference clock signal $F_R$ and net charge is added to the loop. At time $t_1$, the reference clock signal $F_R$ goes high at the clock input 528 to the first flip flop 502 (FIG. 5). The Q output 522 immediately goes high, the first charge pump 506 is enabled begins to provide the up current $I_{up}$ to the loop. Later, at time $t_2$, the out of phase variable clock signal $F_V$ arrives and the second charge pump 508 is enabled to provide the down current $I_{DN}$. The second input of the AND gate 510, signal $R_{DN}$, immediately goes high but the first input of the AND gate 510, signal $R_{UP}$, remains low during the duration of the first delay circuit 512. $R_{UP}$ goes high at time $t_3$. At time $t_4$, following the duration of the second delay circuit 514, the delayed reset signal, indicated by RESET in FIGS. 5 and 8, goes high and the two flip flops are reset. The two charge pumps are immediately disabled and the up current and the down current are discontinued.

Figure 9:
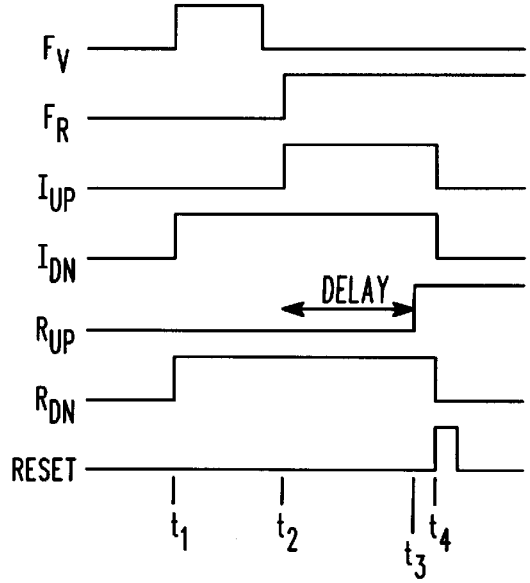
FIG. 9 is a timing diagram illustrating operation of the phase detector circuit of FIG. 5.

FIG. 9 is a timing diagram illustrating operation of the phase detector circuit 500 of FIG. 5 operated in conjunction with a phase locked loop. In FIG. 9, the variable clock signal $F_V$ leads the reference clock signal $F_R$ and net charge is subtracted from. At time $t_1$, the variable clock signal $F_V$ goes high, the second charge pump 508 is enabled and the reset signal $R_{DN}$ at the second input of the AND gate 510 (FIG. 5) goes high. Subsequently, at time $t_2$, the reference clock signal $F_R$ goes high and the up current is supplied to the loop. At time $t_3$, after the duration of the first delay circuit 512, the reset signal $R_{UP}$ at the first input of the AND gate 510 goes high and the reset signal is asserted at the output 542 of the AND gate 510. At time $t_4$, after the duration of the second delay circuit 514, the delayed reset signal RESET is applied to the reset input 520 of the first flip flop 502 and the reset input 524 of the second flip flop 504. With the flip flops reset, the charge pumps are disabled and the up current and the down current are both discontinued.

Figure 10:
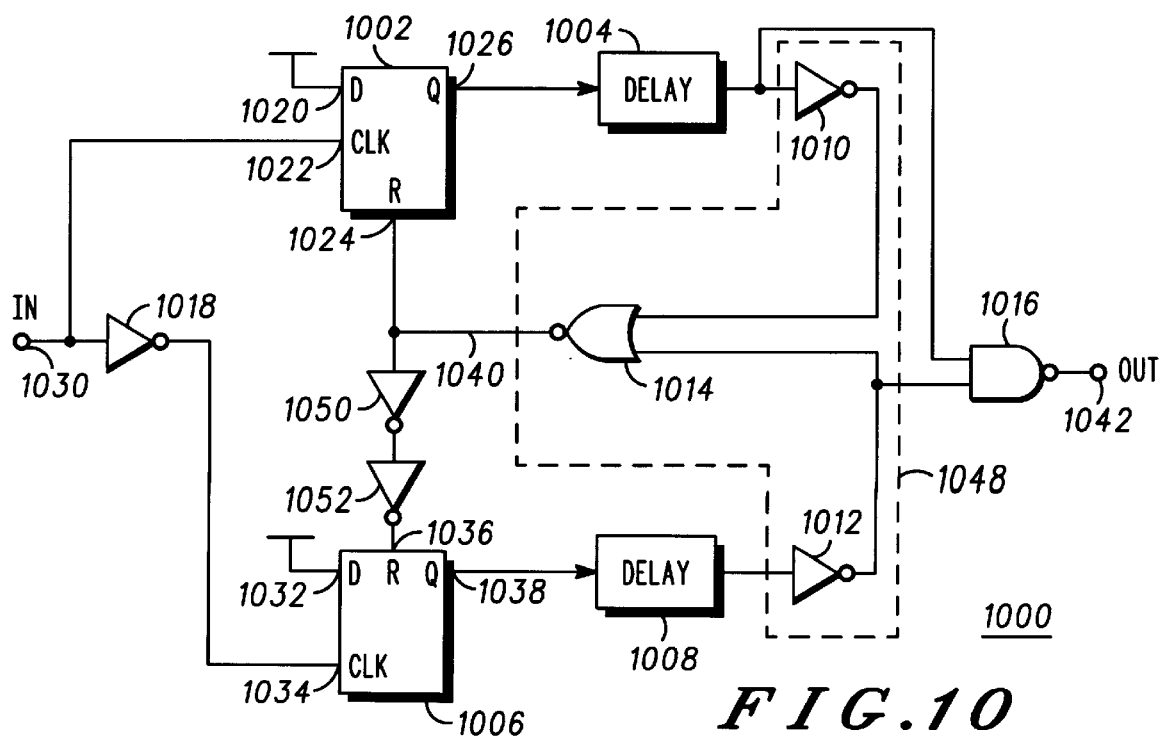
FIG. 10 is a block diagram of a delay circuit for use in the phase detector circuit of FIG. 5.

FIG. 10 shows a block diagram of a delay circuit 1000 which may be used in the phase detector circuit 100 of FIG. 1 or the phase detector circuit 500 of FIG. 5. The delay circuit 1000 includes a first flip flop 1002, a first delay element 1004, a second flip flop 1006, a second delay element 1008, an inverter 1010, an inverter 1012, an NOR gate 1014, a NAND gate 1016 and an inverter 1018. The first flip flop 1002 and the second flip flop 1006 are D-type flip flops in the illustrated embodiment, but other circuits and other types of flip flops could be used.

The first flip flop 1002 has a data input 1020 labelled D in FIG. 10, a clock input 1022, a reset input 1024 labelled R and an output 1026 labelled Q. The data input 1020 is tied to the positive reference potential so that it always receives a logic high input. The clock input 1022 is configured to receive a clock signal from the input 1030 to the delay circuit 1000. The output 1026 is coupled to the first delay element 1004. When used in conjunction with a phase detector circuit, the first flip flop 1002 forms a first clocked circuit which receives the output signal from a first storage circuit, such as first flip flop 502 (FIG. 5) and produces a first clocked signal in response.

Similarly, the second flip flop 1006 has a data input 1032 tied to the positive reference potential, a clock input 1034, a reset input 1036 and an output 1038. The clock input 1034 is configured to receive the clock signal from the input 1030 after inversion in the inverter 1018. Thus, the first flip flop 1002 and the second flip flop 1006 operate responsive to opposite phases of the clock signal at the input 1030. The output 1038 is coupled to the second delay element 1008.

The first delay element 1004 and the second delay element 1008 operate to delay the signal received from each respective flip flop by a predetermined amount. Each delay element may be fashioned from resistor-capacitor (R-C) a delay or a current-capacitor delay. In the illustrated embodiment, the two delay elements are substantially identical and add approximately 20 ns of delay. When used in conjunction with a phase detector circuit such as phase detector circuit 500 of FIG. 5, the first delay element 1004 delays the first clocked signal from the first flip flop 1002 to produce a delayed first signal and the second delay element 1008 delays the second clocked signal from the second flip flop 1006 to produce a delayed second signal.

The output of the first delay element 1004 is provided to a first input of the NAND gate 1016 and to the inverter 1010. The inverter 1010 inverts the delayed output signal and provides it to the first input of the NOR gate 1014. The output of the second delay element 1008 is inverted in the inverter 1012 and provided to the second input of the NAND gate 1016 and the second input of the NOR gate 1014. The inverter 1010, the inverter 1012 and the NOR gate 1014 together form a first combining circuit 1048 which produces a reset signal on line 1040 in response to a delayed first signal from the first delay element 1004 and a delayed second signal from the second delay element 1008. The reset signal is provided to the reset input 1024 of the first flip flop 1002 and to the reset input 1036 of the second flip flop 1006. To prevent possible signal glitches when resetting the flip flops, two inverters, inverter 1050 and inverter 1052 are inserted in the path between the NOR gate 1014 and the reset input 1036 of the second flip flop 1006.

The NAND gate 1016 receives the delayed signal from the first delay element 1004 and the inverted, delayed signal from the second delay element 1008 and logically combines them to form an output signal at the output 1042 of the delay circuit 1000. The output signal is delayed relative to the input signal. For a received pulse, the rising edge of the pulse is delayed in the path including the first flip flop 1002, first delay element 1004 and NAND gate 1016. The falling edge of the pulse is delayed in the path including inverter 1018, the second flip flop 1006, the second delay element 1008 and the NAND gate 1016. Preferably, these two path delays are substantially identical so that the pulse is neither stretched nor shrunk. The NAND gate 1016 thus forms a second combining circuit which produces the delayed output signal in response to combination of the delayed first signal from the first delay element 1004 and the delayed second signal from the second delay element 1008.

Figure 11:
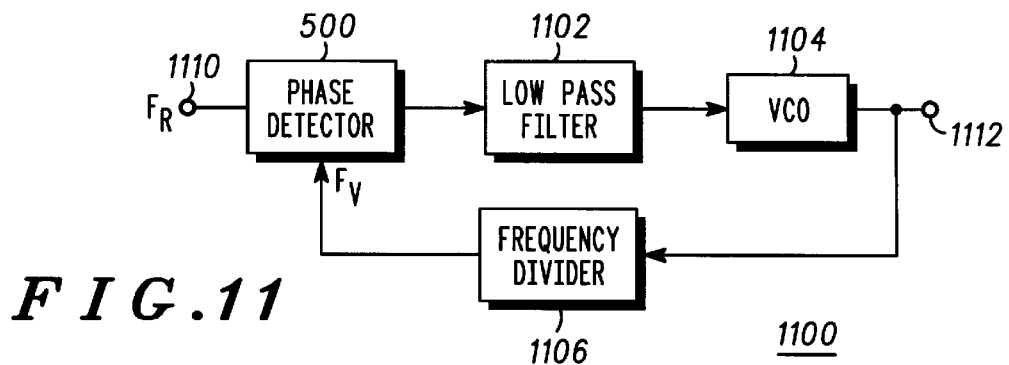
FIG. 11 is a block diagram of a phase locked loop (PLL) employing the phase detector circuit of FIG. 5.

FIG. 11 shows a phase locked loop (PLL) 1100 in which the phase detector circuit 500 of FIG. 5 may be used. The PLL 1100 includes the phase detector circuit 500, a low pass filter 1102, a voltage controlled oscillator (VCO) 1104 and a frequency divider 1106. The PLL 1100 receives a reference signal $F_R$ having a predetermined frequency at an input 1110 and provides an output signal having a well-regulated frequency at an output 1112.

The phase detector circuit 500 receives the reference signal $F_R$ from the input 1110 and a variable-frequency signal $F_V$ from the frequency divider 1106. The phase detector circuit 500 detects a difference between the phase of the reference signal $F_R$ and the phase of the variable-frequency signal $F_V$. The phase detector circuit 500 produces an output which is related to the phase difference and which is tailored to minimize the phase difference. The low pass filter 1102 filters this signal to reduce the bandwidth and provides the signal to the VCO 1104. In response to the filtered phase difference signal, the VCO 1104 adjusts the phase or frequency of the output signal. The output signal is fed back to the frequency divider 1106, which produces the variable-frequency signal for comparison in the phase detector circuit 500.

As can be seen from the foregoing, the present invention provides a phase detector circuit which balances the amount of charge provided to a phase locked loop near the in-phase condition. Charge pumps are reset using the same reset pulse, thereby guaranteeing coincidence of the current pulses supplied to the PLL. Power dissipation, circuit area and the need to precisely match delay elements have been eliminated producing a circuit which is less expensive to produce and operate.

While a particular embodiment of the present invention has been shown and described, modifications may be made. For example, combinatorial logic in the various drawing figures may be altered while maintaining substantially the same functionality. It is therefore intended in the appended claims to cover all such changes and modifications which fall within the true spirit and scope of the invention.

What is claimed is:

1. An improved phase detection apparatus for generating a difference signal for use in a phase locked loop, the phase detection apparatus having a first storage circuit and a second storage circuit each having a reset input and an output, the first storage circuit having a clock input configured to receive a reference clock signal and the second storage circuit having a clock input configured to receive a variable clock signal, wherein the improvement comprises:

a first charge pump coupled to the output of the first storage circuit to provide an up current in response to a first output signal from the first storage circuit;

a first delay circuit coupled to the output of the first storage circuit for producing a delayed output signal in response to the output signal from the first storage circuit;

a second charge pump coupled to the output of the second storage circuit to provide a down current in response to a second output signal from the second storage circuit;

a circuit which combines the delayed output signal and the second output signal to produce a reset signal; and a second delay circuit which delays the reset signal to produce a delayed reset signal, the second delay circuit being coupled to the reset input of the first storage circuit and the second storage circuit.

2. The phase detection apparatus of claim 1 wherein the first storage circuit and the second storage circuit each comprise D-type flip flop circuits having a data input coupled to a logic high level.

3. The phase detection apparatus of claim 1 wherein the circuit which combines the delayed output signal and the second output signal comprises an AND gate.

4. The phase detection apparatus of claim 1 wherein the delayed reset signal is provided to the reset input of the first storage circuit and the second storage circuit substantially simultaneously.

5. The phase detection apparatus of claim 1 wherein the first delay circuit comprises:

a first clocked circuit which receives the first output signal from the first storage circuit and produces a first clocked signal in response;

a first delay element which delays the first clocked signal to produce a delayed first signal;

a second clocked circuit which receives an inverted version of the first output signal from the first storage circuit and produces a second clocked signal in response;

a second delay element which delays the second clocked signal to produce a delayed second signal;

a first combining circuit which produces a reset signal in response to the delayed first signal and the delayed second signal, the first clocked circuit and the second clocked circuit being reset to an initial condition in response to the reset signal; and a second combining circuit which produces the delayed output signal in response to combination of the delayed first signal and the delayed second signal.

6. The phase detection apparatus of claim 5 wherein the first delay circuit further comprises a third delay circuit coupled between the first combining circuit and the second clocked circuit to delay reset of the second clocked circuit relative to reset of the first clocked circuit.

7. A method for detecting a phase difference and generating a phase difference signal, the method comprising the steps of:

receiving a reference clock signal and a variable clock signal;

generating a first output signal in response to the reference clock signal;

generating a second output signal in response to the variable clock signal;

delaying the first output signal to produce a delayed first output signal;

generating a reset signal in response to the second output signal and the delayed first output signal;

resetting the first output signal and the second output signal in response to the reset signal; and generating the phase difference signal in response to the first output signal and the second output signal.

8. The method of claim 7 wherein delaying the first output signal comprises the steps of:

clocking a first signal using the first output signal;

producing a first delayed signal in response to the first signal;

clocking a second signal using the first output signal;

producing a second delayed signal in response to the second signal;

resetting the first signal and the second signal in response to combination of the first delayed signal and the second delayed signal; and combining the first delayed signal and the second delayed signal to produce the delayed first output signal.

9. The method of claim 8 wherein combining the first delayed signal and the second delayed signal comprises forming the logical NAND of the first delayed signal and the second delayed signal.

10. The method of claim 7 wherein the method further comprises the steps of generating an up current as the phase difference signal in response to the first output signal and generating a down current as the phase difference signal in response to the second output signal.

11. The method of claim 9 further comprising the step of delaying the reset signal by a predetermined delay time before resetting the first output signal and the second output signal.

12. A linearized phase detector comprising:

a first flip flop having a clock input configured to receive a reference clock signal, a reset input and an output, the first flip flop providing a first output signal at the output in response to the reference clock signal;

a second flip flop having a clock input configured to receive a variable clock signal, a reset input and an output, the second flip flop providing a second output signal at the output in response to the variable clock signal;

a first charge pump coupled to the output of the first flip flop, the first charge pump providing an up current to an output of the linearized phase detector when the first output signal from the first flip flop is at a logic high level;

a second charge pump coupled to the output of the second flip flop, the second charge pump providing a down current to the output of the linearized phase detector when the second output signal from the second flip flop is at the logic high level;

a first delay circuit coupled to the output of the first flip flop to produce a delayed output signal in response to the first output signal;

a combining circuit which combines the delayed output signal and the second output signal to produce a reset signal; and a second delay circuit coupled between the combining circuit and the reset input of the first flip flop and the reset input of the second flip flop, the second delay circuit delaying the reset signal to produce a delayed reset signal.

* * * * *